United States Patent
Darbee et al.

(10) Patent No.: US 6,195,033 B1
(45) Date of Patent: *Feb. 27, 2001

(54) KEY MOVER (75) Inventors: Paul V. Darbee, Santa Ana; Don G. DuPerault, Chino; Qiuju Luo, Orange, all of CA (US)

(73) Assignee: Universal Electronics Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/408,729

(22) Filed: Sep. 29, 1999

Related U.S. Application Data (63) Continuation of application No. 07/990,854, filed on Dec. 11, 1992, now Pat. No. 6,014,092, which is a continuation-in-part of application No. 07/913,523, filed on Jul. 14, 1992, now abandoned, which is a continuation-in-part of application No. 07/586,957, filed on Sep. 24, 1990, now abandoned, which is a continuation of application No. 07/127,999, filed on Dec. 2, 1987, now Pat. No. 4,959,810, which is a continuation-in-part of application No. 07/109,336, filed on Oct. 14, 1987, now abandoned.

(51) Int. Cl.[7] .................................................. H04L 17/02
(52) U.S. Cl. .......................... 341/176; 341/23; 345/167; 345/172; 340/825.25; 708/146
(58) Field of Search ................................ 341/22, 23, 176; 340/825.25, 825.69, 825.72; 345/169, 172; 708/146, 144, 145

(56) References Cited

U.S. PATENT DOCUMENTS

| | | |
|---|---|---|
| 4,291,385 | 9/1981 | Osborne et al. . |
| 4,623,887 | 11/1986 | Welles et al. . |
| 4,626,847 | 12/1986 | Zato . |
| 4,626,848 | 12/1986 | Ehlers . |
| 4,825,200 | 4/1989 | Evans et al. . |
| 5,045,947 | 9/1991 | Beery . |
| 5,175,538 | 12/1992 | Kurita . |
| 5,237,319 | 8/1993 | Hidaka et al. . |

FOREIGN PATENT DOCUMENTS

| | | |
|---|---|---|
| 0 289 625 | 11/1988 | (EP) . |
| 2 072 791 | 3/1990 | (JP) . |

Primary Examiner—Michael Horabik
Assistant Examiner—Timothy Edwards, Jr.
(74) Attorney, Agent, or Firm—Mark R. Galis; Gary R. Jarosik (57) ABSTRACT

The invention teaches remote control device for reassigning functions associated with one key to another key, wherein the functions are stored in memory. In one embodiment the remote control comprises a memory and a plurality of function instructions stored in the memory, including a first function instruction and a second function instruction. A plurality of keys, including a first key, is operably connected to execute the first function instruction. Reassignment programming is stored in memory and provides for connecting the first key such that it will execute the second function instruction instead of the first function.

3 Claims, 6 Drawing Sheets

KEY REASSIGNMENT TABLE

| | KEY NUMBER | SHIFT BIT | MODE | DEVICE TYPE | COMMAND DATA |
|---|---|---|---|---|---|
| ENTRY 1 | | | | | |
| ENTRY n | | | | | |
| LAST ENTRY | KEY NUMBER | SHIFT BIT | MODE | DEVICE TYPE | COMMAND DATA |
| | END OF TABLE MARKER | | | | |

DEVICE DATA TABLE

| # OF DATA BYTES (n) IN THIS ENTRY |
|---|
| DATA BYTE 1 |
| ⋮ |
| DATA BYTE n |
| # OF DATA BYTES IN ENTRY |
| |

KEY MOVER

CROSS REFERENCE TO RELATED APPLICATIONS

This application is a Continuation of U.S. patent application Ser. No. 07/990,854, filed Dec. 11, 1992, now U.S. Pat. No. 6,014,092 which is a Continuation-in-Part of U.S. patent application Ser. No. 07/913,523 filed Jul. 14, 1992, which is abandoned and is a Continuation-in-Part of U.S. patent application Ser. No. 07/586,957 filed Sep. 24, 1990 which is abandoned and is a Continuation of U.S. patent application Ser. No. 07/127,999 filed Dec. 2, 1987 which issued U.S. Pat. No. 4,959,810 on Sep. 25, 1990 which is a Continuation-in-Part of U.S. patent application Ser. No. 07/109,336 filed Oct. 14, 1987 which is abandoned.

FIELD OF THE INVENTION

The present invention relates to a remote control of the type which is hand held and which can be coupled via coded infrared signals with a remote control receiver built into a television or other remotely controlled electrical apparatus to turn on the apparatus, such as the television, at a distance, to adjust the volume, tone and brightness, to change channels, to turn the television off and to perform other functions, and more specifically to a remote control wherein functions can be moved or transferred to different keys or pushbuttons for the convenience of the user.

BACKGROUND OF THE INVENTION

Heretofore it has been proposed to provide a reconfigurable remote control device and programmable functions for such a remote control device which will enable one to learn, store and retransmit infrared codes that are emitted from the remote control device for a remotely controlled apparatus, such as a television.

For example, in the Welles II U.S. Pat. No. 4,623,887 and the Ehlers U.S. Pat. No. 4,626,848, there is disclosed a reconfigurable remote control device which has the ability to learn, store and repeat remote control codes from any other infrared transmitter. Such a reconfigurable remote control transmitter device includes an infrared receiver, a microprocessor, a non-volatile random access memory (RAM), a scratch pad random access memory, and an infrared transmitter.

According to the teachings of the Ehlers patent, the infrared signals received by the remote control device are in bursts of pulses and the device counts the number of pulses in each burst as well as the time duration of each pause in a transmission between bursts.

The Darbee et al U.S. Pat. No. 4,959,810, of which this application is a Continuation-in-Part, discloses a universal remote control device having terminals for enabling code data to be supplied from outside the device through the terminals and a CPU to a RAM or ROM in the device.

Hand held remote controls of necessity have a finite number of keys and, because of the diversity of possible target devices, cannot offer a dedicated key for every possible function or feature.

Accordingly, dedicated keys are generally only provided for those functions which are common to almost all devices (e.g. Power, Volume, Channel Up/Down, etc.).

One approach to allowing a customer access to those special functions which are unique to his particular brand of remote control device (e.g. tracking or color adjustment, picture-in-picture, etc.) is to provide, in addition to the "standard" keys, a number of generic keys labeled, for example, A, B, C, D, etc. together with a booklet which lists, by brand and model, what functions are available on those keys as disclosed in the Darbee et al U.S. Pat. No. 4,959,810.

The disadvantage of this method is that the number of keys is still quite limited, so the manufacturer of the universal remote control device usually has to select by brand and model which special functions are or are not offered.

Another approach is to provide a special key which, when pressed, allows a multi-key entry sequence to access any one of a large library of special functions. For example, pressing an "A" key followed by two digits (A-n-n) would provide access to up to 100 special, or "extended" functions. The disadvantage of this method is that it requires the user of the device to press the standard keys or pushbuttons multiple times in order to access any of these extended functions.

As will be described in greater detail hereinafter, the remote control device of the present invention overcomes the foregoing disadvantages by including, in the operating program for the remote control device, executable programs or routines which permit the individual user to assign any desired function to almost any key on the keypad. The user is thus able to individually customize his particular device so that his most frequently accessed functions are single keystrokes and/or in the most convenient locations on the keypad.

The executable routines or programs also allow the user to reassign keys "across devices". For example, if a user plays his TV sound through a stereo amplifier, he may wish to reassign the "MUTE" key such that, when his remote control device is switched to TV mode, the mute signal sent in response to the button is that of the stereo amplifier, not that of the TV.

SUMMARY OF THE INVENTION

According to the present invention there is provided a remote control device comprising: a microprocessor including a CPU and a memory; a keypad including a set of keys coupled to the microprocessor; lamp driver circuitry coupled to the microprocessor; circuitry for generating IR signals coupled to the IR lamp driver circuitry; code data for executing command functions for a plurality of devices of different manufacturers stored in the memory; a Key Reassignment table in the memory containing key identity function data for those keys which have been reassigned by the user; and a program stored in the memory for reassigning a different function for the same or different device to a key on the keypad upon the inputting of a predetermined keystroke sequence on the keypad.

Further according to the present invention there is provided a method for reassigning a key function to a key on a keypad in a remote control device of the type described above comprising the steps of: entering a predetermined keystroke sequence on the keypad; determining if the predetermined keystroke sequence is a command to perform special function processing to reassign to a key a function of a device to be controlled; determining if a function key has been depressed; storing the key identity and current mode into a "FROM" entry in the Key Reassignment Table; determining if the next key depressed is a mode key; setting the new mode; determining if a function sequence of keystrokes has been entered on the keypad for a valid function for the device and mode selected; obtaining device TYPE and command function data corresponding to the function and mode selected from the Key Reassignment Table; and, storing the data in a "TO" entry in the Key Reassignment Table, thereby establishing a "FROM=TO" relationship between the physical key ("FROM") and the new, reassigned, function which it is to perform ("TO").

DESCRIPTION OF EXEMPLARY EMBODIMENTS

Figure 1:
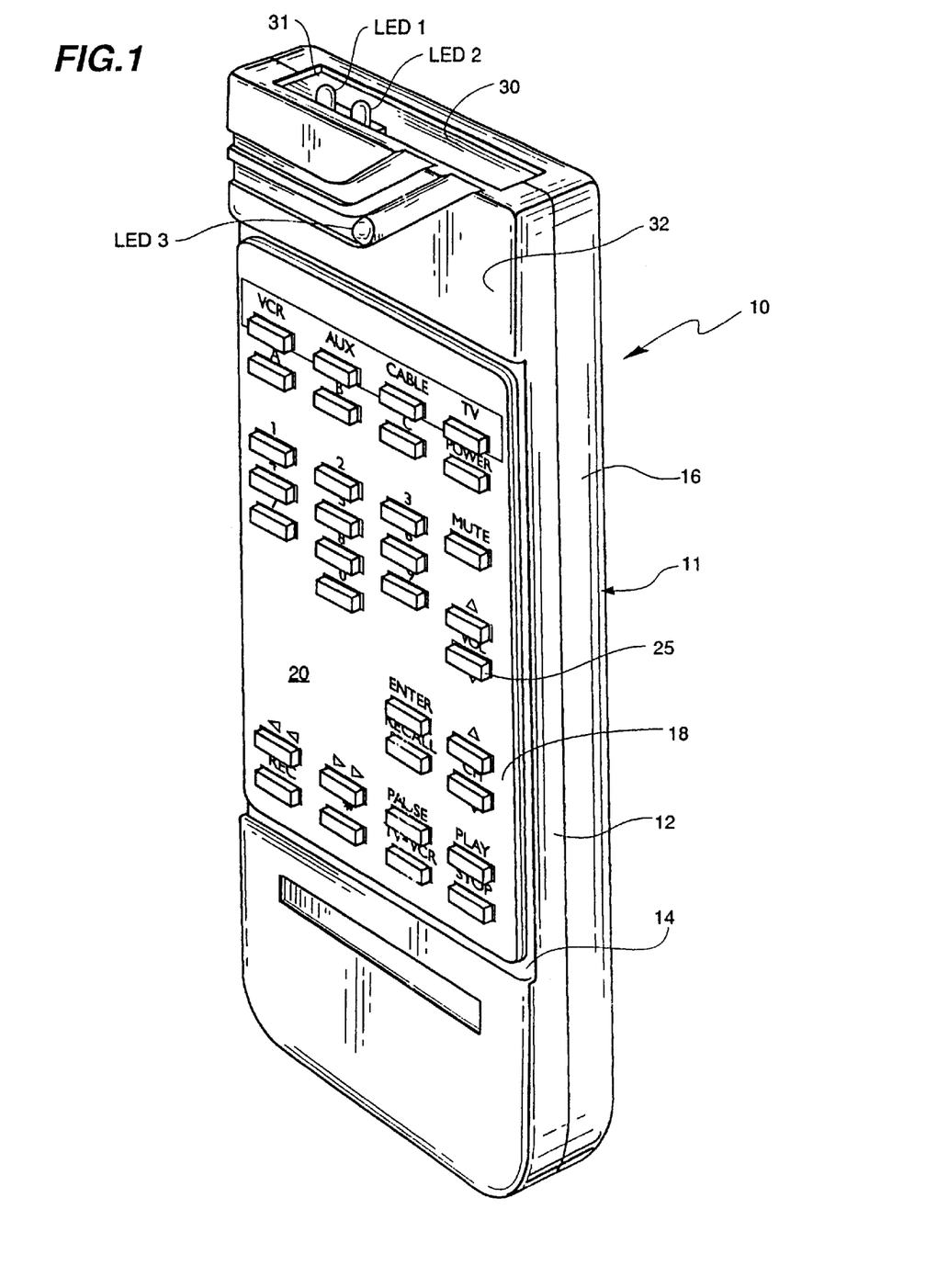
FIG. 1 is a front perspective view of a remote control device constructed according to the teachings of the present invention.

Referring now to FIG. 1 in greater detail, there is illustrated therein a remote control device 10 constructed according to the teachings of the present invention.

As shown, the device 10 includes a housing 11 including an upper housing member 12 having a base panel 14, and a lower housing member 16. An overlay face panel 18 is positioned over the base panel 14 and has a keyboard layout, i.e. keypad, 20 on the outer surface thereof.

The two panels 14 and 18 have openings therethrough for receiving elastomeric pushbuttons 25, for the keypad 20, all of which extend from and are fixed to or integral with an elastomeric body panel.

Figure 2:
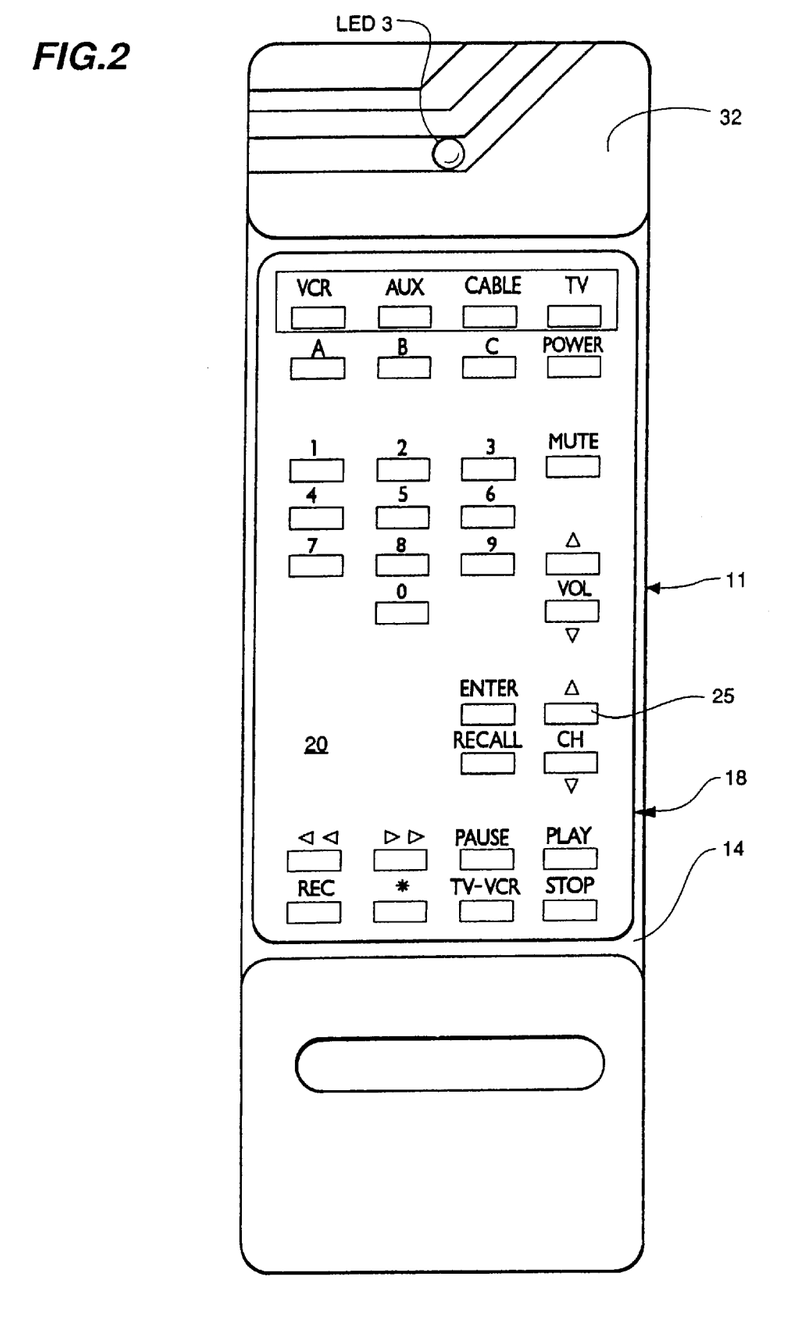
FIG. 2 is a front plan view of the control device shown in FIG. 1 and shows the various keys or pushbuttons of the device.

The pushbuttons 25 are arranged in rows and columns and are identified as follows on the keypad 20:

| VCR | AUX | CABLE | TV |
|---|---|---|---|
| A | B | C | POWER |
| 1 | 2 | 3 | MUTE |
| 4 | 5 | 6 | |
| 7 | 8 | 9 | |
| | | 0 | VOL |
| | | ENTER | |
| | | RECALL | CH |
| | | PAUSE | PLAY |
| REC | * | TV-VCR | STOP |

This arrangement is shown in FIG. 2, and the manner in which these pushbuttons 25 are utilized in operating the control device 10 will be described in greater detail hereinafter.

At a top or forward end of the device 10 there is provided an opening 30 for two light emitting diodes LED 1 and LED 2. The opening 30 is covered by an infrared-transparent lens 31. Also provided on a top surface 32 of the upper housing member 12 of the control device 10 is a light emitting diode, LED 3, by which information is communicated to the user of the device 10.

FIG. 2 is a plan view of the keyboard or keypad 20 and shows the different keys or pushbuttons 25 of the control device 10 extending through the base panel 14 of upper housing member 12 and the face panel 18 where the label or identification for each pushbutton or key 25 is shown. The light emitting diode LED 3 is also indicated.

Figure 3:
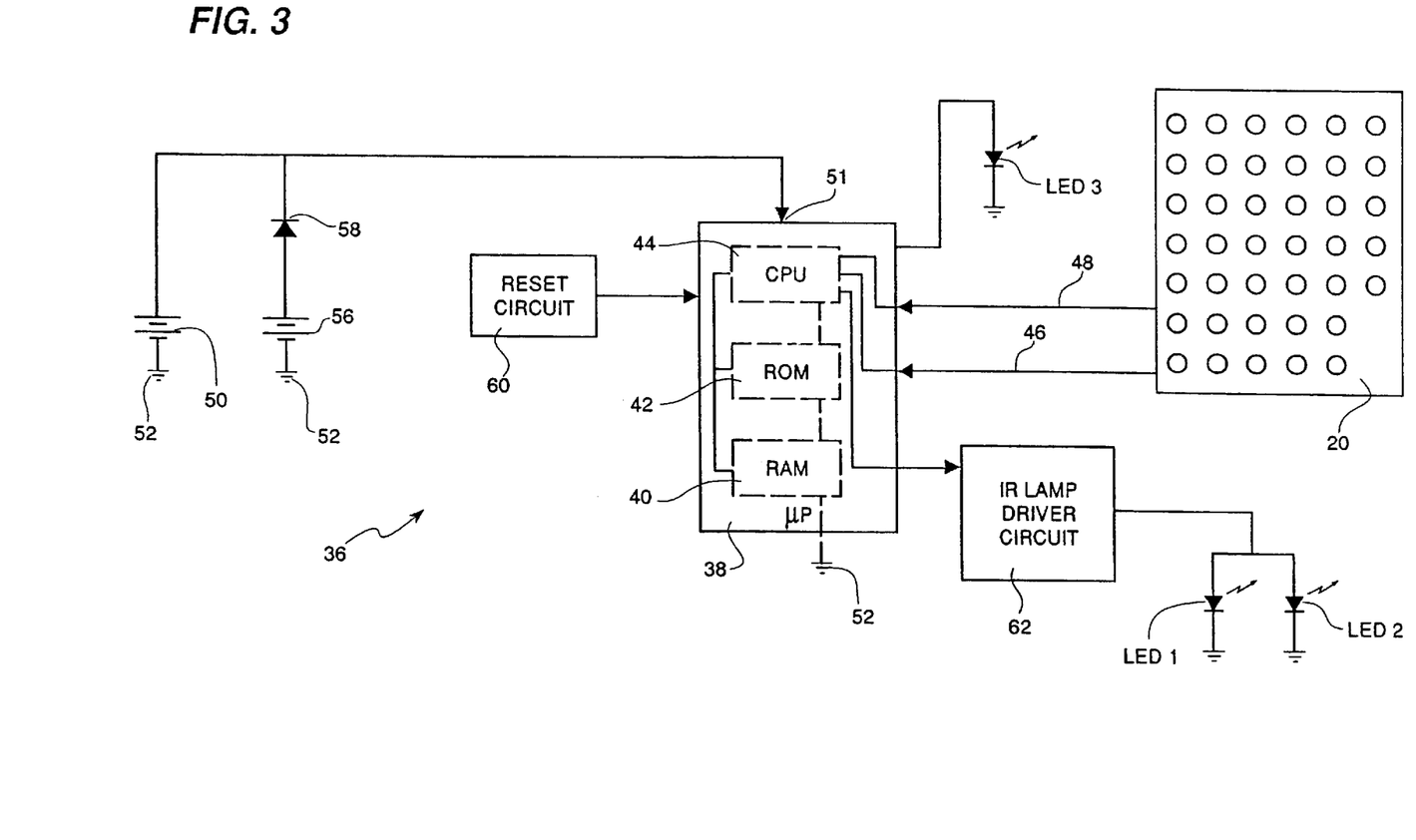
FIG. 3 is a block electrical schematic circuit diagram of the remote control device shown in FIGS. 1 and 2.

FIG. 3 is a block electrical schematic circuit diagram of the operating circuitry 36 in the remote control device 10 which includes a microprocessor 38, including a RAM 40, a ROM 42 and a CPU 44. The keypad 20 is coupled to the microprocessor 38 by an interrupt line 46 and a bus 48 TO to the CPU 44.

A power supply in the form of a battery 50 is connected between a + voltage input 51 to the microprocessor 38 and a system ground 52. A backup battery 56 is connected through a diode 58 to the + voltage input 51 to maintain the data stored in the memory 42 and/or 44 to provide a non-volatile system.

A reset circuit 60 is coupled to the microprocessor 38, as shown.

An output of the CPU 44 is connected to an IR lamp driver circuit 62 which outputs a voltage to the two light emitting diodes LED 1 and LED 2.

The status indicating LED 3 is connected to an input of the microprocessor 38.

The electrical circuitry 36 is generally of the type disclosed in greater detail in the Darbee et al U.S. Pat. No. 4,959,810, the disclosure of which is incorporated herein by reference.

The operating program for the remote control device 10 which is stored in the ROM 42 or RAM 40 is very similar to the operating programs disclosed in the Darbee et al U.S. Pat. No. 4,959,810, incorporated herein by reference, with the exception of the KEY MOVER routine or program described below, for moving or assigning a selected function to a selected key.

Figure 4:
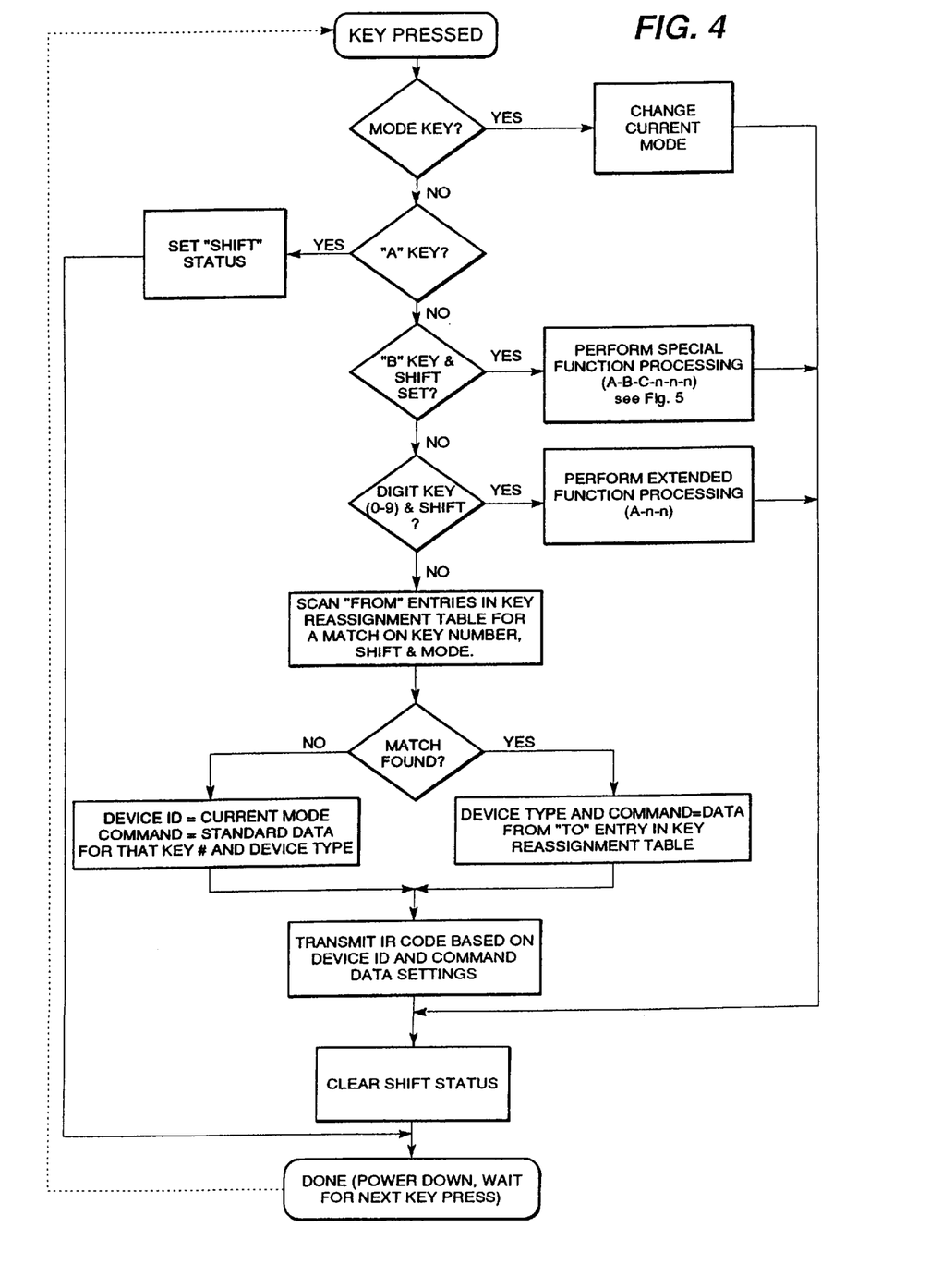
FIG. 4 is a flow chart of the steps performed by a key reassignment program entitled KEY MOVER: NORMAL FUNCTION.

With reference to FIG. 4, in the normal operation of the KEY MOVER program, whenever a key is struck, the program determines whether or not it was the mode key and if it was then the mode of operation is changed.

If it was not, the program then determines whether it was the "A" key. If it was, a "Shift" status is set, enabling the program to "remember" during subsequent key presses that the "A" key had been struck.

If the answer is "No", the program then determines if the "B" key has been struck and the "Shift" status is in effect, and if the answer is "Yes", the program enters the special function processing mode for reassigning a key which is described in greater detail below and in connection with the description of FIG. 5.

This special function processing in the reassign mode of operation of the remote control device 10 allows the operator to reassign FUNCTION keys by typing on the keypad 20:

A-B-C-9-9-9<From Func><To Func>.

Thus, one can customize his/her keyboard or keypad 20.

If the user wants keys from a different mode (device) to replace existing keys, that can be done by typing on the keypad 20:

[From Mode] A-B-C-9-9-9<From Func>[To Mode] <To Func>.

For example, if one wants Volume Up (VL+) from a CD to replace Volume Up for a TV, the user will type on the keypad 20:

TV A-B-C-9-9-9 VL+CD VL+

Now, whenever the user is in the TV mode, pressing Volume Up will raise the volume on the CD player, not the TV. One can also make it so that the TV volume operates normally, but pressing keys:

A VL+ will operate the CD volume.

This is accomplished by typing on the keypad 20:

TV A-B-C-9-9-9 A VL+CD VL+

A very desirable feature of the KEY MOVER program is that it allows one ready access to "extended" functions that would otherwise require several keystrokes. For example, if the remote control device 10 is of the type disclosed in U.S. patent application Ser. No. 07/913,523 entitled: REMOTE CONTROL DEVICE WITH FUNCTION SYNTHESIS and where, to effect Color Up, one has to type on the keypad 20:

A-6-3-8, one can move that function to the Channel Up key by typing:

TV A-B-C-9-9-9 A CH+A-6-3-8.

Now, pressing CH+ will change channels on the TV normally, but pressing A CH+ will send Color Up.

One can assign alternate functions to any key except the mode (device) keys or the "A" key.

Returning to the program, if the pressing of the "B" key and setting of the "Shift" status have not occurred, the program then determines whether a DIGIT (number) key has been depressed and whether the "Shift" status is in effect.

If the answer is "Yes", extended function processing is performed such as synthesizing of an alternate or extended function in the manner described in U.S. patent application Ser. No. 07/913,523 entitled: REMOTE CONTROL DEVICE WITH FUNCTION SYNTHESIS, the disclosure of which is incorporated herein by reference.

If the answer was "No" to the question of whether a DIGIT (number) key has been struck and "Shift" status is in effect, the program scans the "FROM" entries in a Key Reassignment Table for a match on key number,"Shift" status and mode. Then, a determination is made to see if a match has been found. If a match is found, then the device data format and command=data from the corresponding "TO" entry in the Key Reassignment Table is sent to the IR lamp driver circuit 62 and to the IR code is transmitted based on that device data format and command data settings.

If no match was found, then the current mode's standard data for that key number and device data format is sent to the IR lamp driver circuit 62 to cause the IR code to be transmitted on the standard device ID and command data setting.

After the IR code is transmitted, as well as after the performance of the special function and the extended function (synthesis), the "Shift" status is cleared.

Stated in a simplified way, whenever a key is struck, the KEY MOVER routine or program illustrated in FIG. 4, after checking for the striking of special keys or functions, begins by scanning a special table, the Key Reassignment Table, in memory. This table is for all keys which have been reassigned. If a match is found, the program extracts from the second part of the table entry the device data format and command information to be sent in lieu of the standard assigned function for that key and mode.

If no match is found, the standard device data format and command data are used.

Figure 5:
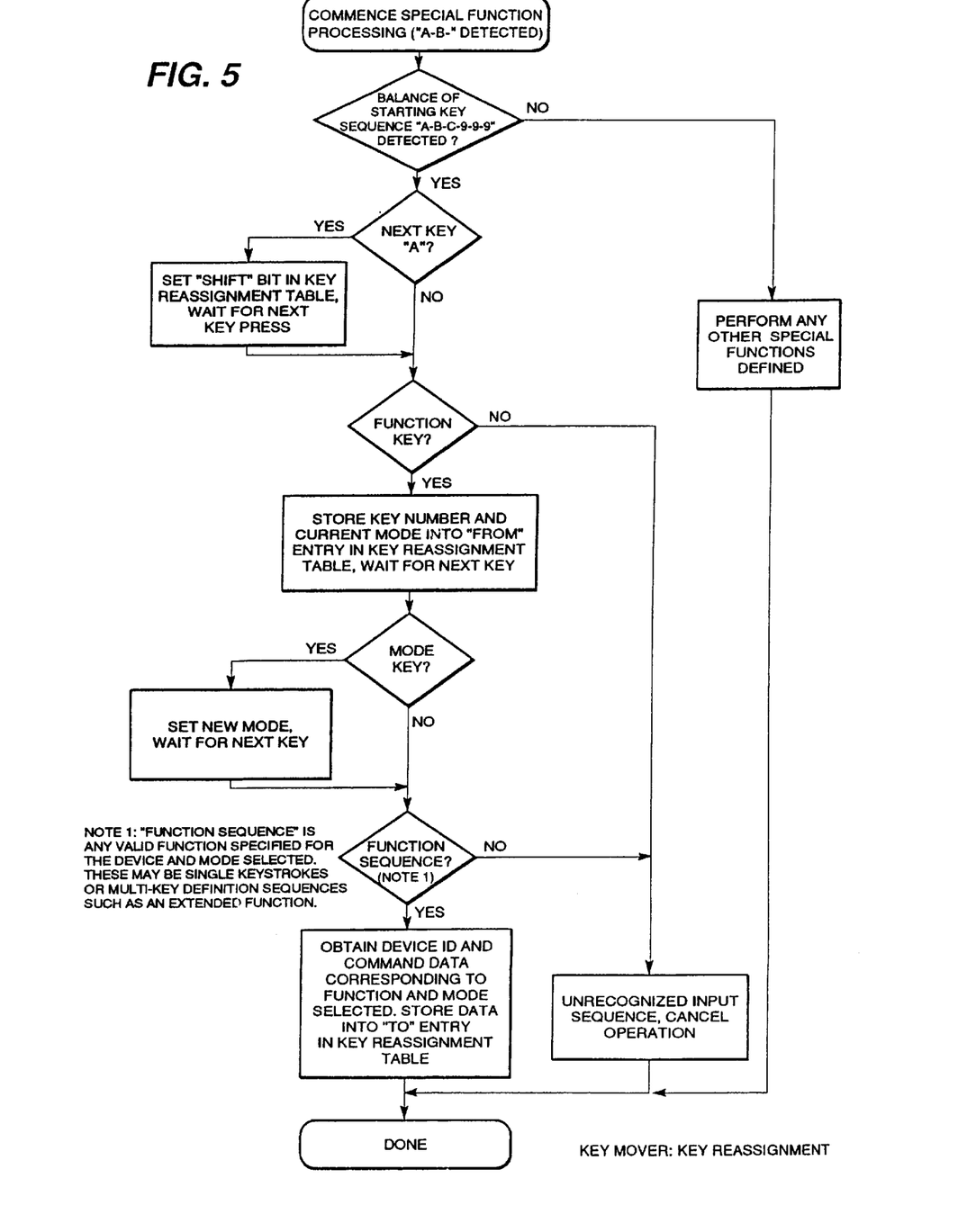
FIG. 5 is a flow chart of the steps performed in the execution of a program for reassignment of a key function entitled KEY MOVER: KEY REASSIGNMENT.

The special KEY MOVER function program, protocol or subroutine is illustrated in FIG. 5 and starts with the detection of a key sequence, such as A-B-C-9-9-9.

Then, it is determined whether the next key pressed was "A".

If "Yes", then the "Shift" bit is set in the Key Reassignment Table and the program waits for the depression of another key.

Next, the program determines if a function key has been depressed. If "No", the program goes to exit.

If "Yes", the key number and current mode are stored into a "FROM" entry in the Key Reassignment Table (FIG. 6) and the program waits for the next key.

Next, a determination is made whether a mode key has been depressed. If "Yes", the new mode is set and the program waits for the next key stroke.

After that, or if the answer was "No", a determination is made if one or more keys have been depressed for a valid function sequence. If "No", the program exits.

Figure 6:
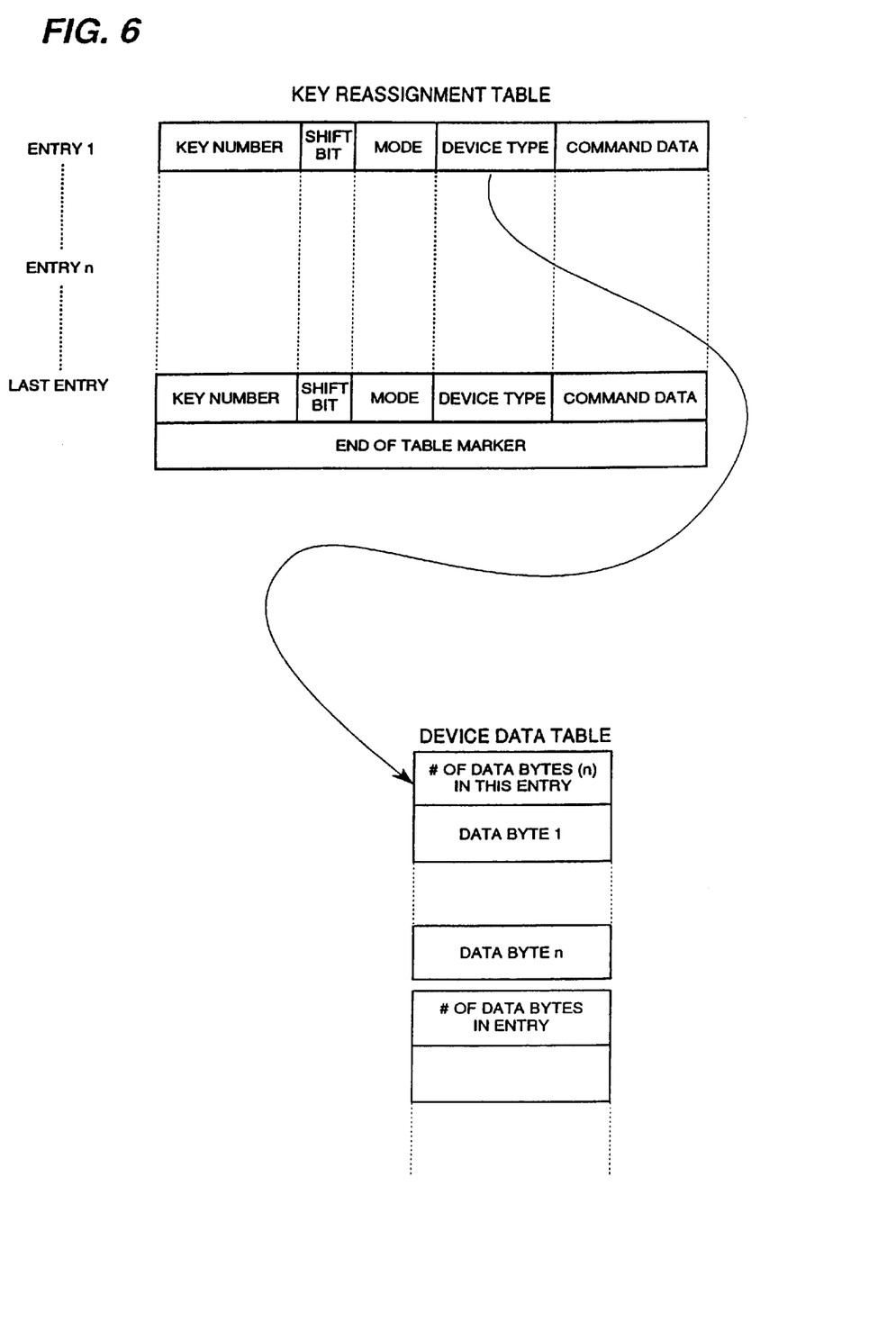
FIG. 6 is a table showing the a Key Reassignment Table of the KEY MOVER program.

If "Yes", the program obtains a device data format and command data corresponding to the function and mode selected and stores this data into a "TO" entry in the Key Reassignment Table which is illustrated in FIG. 6.

Whenever a special key sequence "A-B-C-9-9-9" is used, the operating program for the remote control device switches to the special function processing, KEY MOVER, program illustrated in FIG. 5, i.e. the "KEY MOVER" program as explained above and as indicated in the special function processing step of FIG. 4 and as further described in connection with the description of the flow chart in FIG. 5.

If a complete definition of the device data format requires more space than is provided for in the Key Reassignment Table shown in FIG. 6, the initial table entry under "DEVICE TYPE" simply may be a pointer to a secondary table, DEVICE DATA TABLE, containing additional information, as shown in FIG. 6.

From the foregoing description, it will be apparent that the KEY MOVER program of the present invention provides a number of advantages some of which have been described above and others of which are inherent in the invention. In particular, a dedicated or universal remote control device having the KEY MOVER program therein enables the user of the device to customize his particular device so that his most frequently accessed functions are single key strokes and/or in the most convenient location on the keypad 20. Also, the method of the present of the present invention, the Key Mover program, and operating keys (A-B-C-9-9-9) can be modified without departing from the teachings of the present invention. Accordingly, the scope of the invention is only to be limited as necessitated by the accompanying claims.

What is claimed is:

1. A medium storing instructions for use in reassigning functions on a remote control device having a plurality of function keys and a memory storing a remote control function command, the instructions performing steps comprising:

checking for an entry of at least one function key selected from the plurality of function keys;

checking for an entry of the remote control function command;

checking for an entry of a reassignment command code; and in response to the entry of the reassignment command code, the at least one function key and the remote control function command, mapping the remote control function command to the at least one function key thereby effectively reassigning functions of the remote control device.

2. The medium as recited in claim 1, wherein the remote control is adapted to control a plurality of devices and wherein the steps of the entry of the remote control function command further comprises checking for the entry of a first device selected from the plurality of devices.

3. A medium storing instructions for use in issuing function commands from a remote control device having a plurality of function keys and a memory storing a first remote control function command and a key reassignment table in which a second remote control function command is mapped to at least one key selected from the plurality of function keys, the instructions performing steps comprising:

checking for the activation of at least one of the plurality of function keys;

scanning the key reassignment table to determine if the second remote control function is mapped to the function key activated;

if the determination is positive, issuing from the remote control signals consistent with the second remote control function command; and if the determination is negative, issuing from the remote control signals consistent with the first remote control function command.

* * * * *

UNITED STATES PATENT AND TRADEMARK OFFICE
CERTIFICATE OF CORRECTION

PATENT NO. : 6,195,033 B1  
DATED : February 27, 2001  
INVENTOR(S) : Paul V. Darbee, Don G. DuPerault, Qiuju Luo Page 1 of 1

It is certified that error appears in the above-identified patent and that said Letters Patent is hereby corrected as shown below:

Column 7,  
Line 12, "steps" should be -- step -- and after the first "of" insert -- checking for --

Signed and Sealed this

Twenty-ninth Day of January, 2002

Attest:

JAMES E. ROGAN  
Attesting Officer  
Director of the United States Patent and Trademark Office